(12) United States Patent
Matano

(10) Patent No.: US 8,089,305 B2
(45) Date of Patent: Jan. 3, 2012

(54) POWER SUPPLY VOLTAGE RESET CIRCUIT AND RESET SIGNAL GENERATING METHOD

(75) Inventor: Tasuya Matano, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 594 days.

(21) Appl. No.: 11/960,771

(22) Filed: Dec. 20, 2007

(65) Prior Publication Data

US 2008/0150497 A1 Jun. 26, 2008

(30) Foreign Application Priority Data

Dec. 26, 2006 (JP) ................................ 2006-349130

(51) Int. Cl.
*H03L 7/00* (2006.01)
(52) U.S. Cl. ......... 327/142; 327/143; 327/198; 327/538
(58) Field of Classification Search .................. 327/142, 327/143, 198, 530, 538–543, 546; 323/312–317
See application file for complete search history.

(56) References Cited

U.S. PATENT DOCUMENTS

| | | | | |
|---|---|---|---|---|
| 5,936,443 A | * | 8/1999 | Yasuda et al. | 327/143 |
| 6,809,576 B1 | * | 10/2004 | Yamasaki | 327/540 |
| 6,958,947 B2 | * | 10/2005 | Park et al. | 365/228 |
| 7,589,584 B1 | * | 9/2009 | Bui | 327/538 |
| 2005/0077923 A1 | * | 4/2005 | Kim et al. | 327/50 |
| 2007/0024351 A1 | * | 2/2007 | Kang | 327/541 |
| 2007/0064513 A1 | * | 3/2007 | Matano | 365/226 |

FOREIGN PATENT DOCUMENTS

| | | |
|---|---|---|
| JP | 2002-111466 | 4/2002 |
| JP | 2006-262180 | 9/2006 |

* cited by examiner

*Primary Examiner* — Lincoln Donovan
*Assistant Examiner* — Brandon Cole
(74) *Attorney, Agent, or Firm* — Young & Thompson

(57) ABSTRACT

A power supply voltage reset circuit, provided in an apparatus having an internal circuit capable of adjusting an internal power supply voltage, for resetting the internal circuit when a power supply voltage of the apparatus rises, and includes: a unit that generates an internal power supply voltage reference signal and changes a signal level thereof; a unit that generates an internal reference voltage to be a reference level in generating a reset signal for the internal circuit at a time of rising of the power supply voltage; a unit that generates a power-on adjustment voltage which rises later than the internal reference voltage at the time of rising of the power supply voltage and becomes greater than the internal reference voltage after a predetermined time passes; and a unit that generates the reset signal by comparing the internal reference voltage with the power-on adjustment voltage.

14 Claims, 5 Drawing Sheets

POWER SUPPLY VOLTAGE RESET CIRCUIT AND RESET SIGNAL GENERATING METHOD

BACKGROUND OF THE INVENTION

1. Field of the Invention

The present invention relates to a power supply voltage reset circuit which performs power-on resetting of a semiconductor integrated device, such as DRAM (Dynamic Random Access Memory), when the semiconductor integrated device is powered on. Particularly, the present invention relates to a power supply voltage reset circuit and a reset signal generating method which can suppress generation of a reset signal in an internal circuit (or peripheral circuit) provided in DRAM or the like depending on the level of a power supply voltage under adjustment at the time of performing a test of adjusting the power supply voltage of the internal circuit.

Priority is claimed on Japanese Patent Application No. 2006-349130 filed on Dec. 26, 2006, the contents of which are incorporated herein by reference.

2. Description of the Related Art

FIG. 4A is a diagram showing the structure of a conventional reset circuit in a semiconductor integrated device, such as DRAM. In FIG. 4A, an internal power supply voltage (working voltage) Vint is supplied to a specific internal circuit (peripheral circuit or the like) 4 from a voltage control circuit 5. An internal-circuit reset signal generator 60 generates a reset signal by comparing the voltage level of an internal reference voltage Vref, which is the most basic voltage in a semiconductor integrated device, with the voltage level of the internal power supply voltage Vint (or internal power supply voltage reference signal Vintref for generating the internal power supply voltage Vint) with each other by means of a comparator 61, and applies a reset signal PRESET to the internal circuit 4 via a buffer gate 62. The voltage control circuit 5 generates various control voltages needed for the operation of the DRAM or the like from a power supply voltage VDD of the semiconductor integrated device. The internal reference voltage Vref and the internal power supply voltage Vint are generated from the power supply voltage VDD by the voltage control circuit 5.

FIG. 4B is a diagram showing waveforms at individual sections at the rising of the power supply voltage. In FIG. 4B, when the power supply voltage VDD starts rising at time t0, the voltages at the individual sections start increasing. At time t1, the level of the internal reference voltage Vref is settled first. As the internal power supply voltage Vint rises later than the internal reference voltage Vref due to the influence of the load of the internal circuit 4, the internal power supply voltage Vint changes in a state of Vref>Vint before time t2.

Because Vref>Vint is satisfied between time t1 (or the time at which the power supply voltage VDD has reached the operation start voltage of the internal-circuit reset signal generator 60) and time t2, the reset signal PRESET becomes a high level. As the reset signal PRESET becomes a high level, the internal circuit 4 is reset upon power-on. After time t2, Vref<Vint is satisfied and thus the reset signal PRESET becomes a low level, canceling the reset state of the internal circuit 4. After time t3, the voltages at the individual sections are settled and power-on reset is completed, making the semiconductor integrated device operable.

As described above, the conventional power supply voltage reset circuit compares the voltage level of the internal reference voltage Vref with the voltage level of the internal power supply voltage Vint of a specific internal circuit to generate a reset signal for the internal circuit.

In a test for adjusting the internal power supply voltage of an internal circuit, therefore, when the internal power supply voltage Vint is changed to check the operational margin or the like for the voltage of the internal circuit (peripheral circuit), the reset signal PRESET for the internal circuit is generated depending on the level of the internal power supply voltage Vint. This brings about a problem in the adjustment test, disabling the adjustment test.

In a case where the internal power supply voltage Vint of the internal circuit 4 is changed as shown in FIG. 5 (when the internal power supply voltage Vint is dropped to a voltage level Vint2 from a voltage level Vint1), for example, when Vref>Vint2, the operation of the internal-circuit reset signal generator 60 sets the reset signal PRESET to a high level. As a result, the internal circuit 4 is reset, thus disabling the adjustment test.

One example of the conventional semiconductor integrated device is disclosed in Japanese Unexamined Patent Application, First Publication No. 2006-262180. This semiconductor integrated device is intended to provide a semiconductor device which can accurately detect the power supply voltage and output a power-on reset signal.

A semiconductor integrated circuit disclosed in, for example, Japanese Unexamined Patent Application, First Publication No. 2002-111466 is intended to prevent the circuit state from becoming unstable upon power-on by providing power-on reset circuits for individual power supply voltages even when a plurality of externally input power supply voltages are used.

As described above, the conventional power supply voltage reset circuit compares the voltage level of the internal reference voltage Vref with the voltage level of the internal power supply voltage Vint of the internal circuit to generate a reset signal for the internal circuit. As a result, in a test for adjusting the internal power supply voltage Vint, when the internal power supply voltage Vint is changed to check the operational margin or the like for the voltage of the internal circuit (peripheral circuit), the reset signal PRESET for the internal circuit is generated depending on the level of the internal power supply voltage Vint. This brings about a problem in the adjustment test, disabling the adjustment test.

SUMMARY OF THE INVENTION

The present invention has been made to overcome the foregoing problems, and it is an object of the present invention to provide a power supply voltage reset circuit and a reset signal generating method which suppress generation of a reset signal for an internal circuit, depending on the level of an internal power supply voltage under adjustment at the time of performing a test for adjusting the internal power supply voltage (working voltage) of the internal circuit, thus ensuring smooth execution of the adjustment test.

A first aspect of a power supply voltage reset circuit in accordance with the present invention is provided in an apparatus having an internal circuit capable of variably adjusting an internal power supply voltage, for resetting the internal circuit when a power supply voltage of the apparatus rises, and the power supply voltage reset circuit includes: a unit that generates an internal power supply voltage reference signal and changes a signal level of the internal power supply voltage reference signal to adjust the internal power supply voltage; a unit that generates an internal reference voltage to be a reference level in generating a reset signal for the internal circuit at a time of rising of the power supply voltage of the apparatus; a unit that generates a power-on adjustment voltage which rises later than the internal reference voltage at the time of rising of the power supply voltage of the apparatus and whose voltage level becomes greater than that of the internal reference voltage after a predetermined time passes; and a unit that generates the reset signal by comparing the voltage level of the internal reference voltage with the voltage level of the power-on adjustment voltage.

The power supply voltage reset circuit with the above-described structure generates a power-on adjustment voltage for generating a reset signal upon power-on of an internal circuit, independently of an internal power supply voltage reference signal for adjusting an internal power supply voltage of the internal circuit. The reset signal is generated by comparing the voltage level of the power-on adjustment voltage with the voltage level of the internal reference voltage with each other.

Accordingly, no matter how the level of the internal power supply voltage changes at the time of performing an adjustment test on the internal power supply voltage of an internal circuit, the reset signal for the internal circuit is not generated.

Preferably, in the power supply voltage reset circuit, the unit that generates the reset signal delays the power-on adjustment voltage by a predetermined time and compares the voltage level of the internal reference voltage with the voltage level of the power-on adjustment voltage thus delayed to generate the reset signal.

The power supply voltage reset circuit with the above-described structure generates a power-on adjustment voltage for generating a reset signal upon power-on of an internal circuit, independently of an internal power supply voltage reference signal for adjusting an internal power supply voltage of the internal circuit. The reset signal is generated by delaying the power-on adjustment voltage by a predetermined time, then comparing the voltage level of the internal reference voltage with the voltage level of the delayed power-on adjustment voltage.

Accordingly, no matter how the level of the internal power supply voltage changes at the time of performing an adjustment test on the internal power supply voltage of an internal circuit, the reset signal for the internal circuit is not generated. Because the reset signal can be generated in accordance with the rising of the internal power supply voltage to be applied to the internal circuit, power-on resetting of the internal circuit can be carried out reliably.

A second aspect of a power supply voltage reset circuit in accordance with the present invention is provided in an apparatus having an internal circuit capable of variably adjusting an internal power supply voltage, for resetting the internal circuit when a power supply voltage of the apparatus rises, and the power supply voltage reset circuit includes: an internal reference voltage generating unit that generates an internal reference voltage to be a reference level in generating a reset signal for the internal circuit at a time of rising of the power supply voltage of the apparatus; a various-reference-voltages generating unit that generates reference voltages of a plurality of voltage levels from the power supply voltage of the apparatus; an internal power supply voltage reference signal generating unit that generates an internal power supply voltage reference signal for adjusting the internal power supply voltage by selecting one of the reference voltages of the plurality of voltage levels; an internal power supply voltage generating unit that generates an internal power supply voltage, which corresponds to the internal power supply voltage reference signal, from the power supply voltage of the apparatus, and outputs the internal power supply voltage to the internal circuit; a power-on adjustment voltage generating unit that, by selecting one of the reference voltages of the plurality of voltage levels, generates a power-on adjustment voltage which rises later than the internal reference voltage at the time of rising of the power supply voltage of the apparatus and whose voltage level becomes greater than that of the internal reference voltage after a predetermined time passes; and an internal-circuit reset signal generating unit that generates the reset signal by comparing the voltage level of the internal reference voltage with the voltage level of the power-on adjustment voltage.

In accordance with the power supply voltage reset circuit with the above-described structure, an internal reference voltage generating unit generates an internal reference voltage, an internal power supply voltage reference signal generating unit selects one of reference voltages of a plurality of voltage levels generated by the various-reference-voltages generating unit to generate an internal power supply voltage reference signal, an internal power supply voltage generating unit generates an internal power supply voltage corresponding to the internal power supply voltage reference signal, and outputs the internal power supply voltage to the internal circuit. A power-on adjustment voltage generating unit generates a power-on adjustment voltage which rises later than the internal reference voltage at the time of rising of the power supply voltage and whose voltage level becomes greater than that of the internal reference voltage after a predetermined time passes. An internal-circuit reset signal generating unit compares the voltage level of the internal reference voltage with the voltage level of the power-on adjustment voltage with each other to generate a reset signal for the internal circuit.

Accordingly, no matter how the level of the internal power supply voltage changes at the time of performing an adjustment test on the internal power supply voltage of an internal circuit, the reset signal for the internal circuit is not generated.

Preferably, in the power supply voltage reset circuit, the internal-circuit reset signal generating unit delays the power-on adjustment voltage by a predetermined time and compares the voltage level of the internal reference voltage with the voltage level of the power-on adjustment voltage thus delayed to generate the reset signal.

In the power supply voltage reset circuit with the above-described structure, the internal reference voltage generating unit generates an internal reference voltage, the internal power supply voltage reference signal generating unit selects one of reference voltages of a plurality of voltage levels generated by the various-reference-voltages generating unit to generate an internal power supply voltage reference signal, the internal power supply voltage generating unit generates an internal power supply voltage corresponding to the internal power supply voltage reference signal, and outputs the internal power supply voltage to the internal circuit. The power-on adjustment voltage generating unit generates a power-on adjustment voltage which rises later than the internal reference voltage at the time of rising of the power supply voltage and whose voltage level becomes greater than that of the internal reference voltage after a predetermined time passes. The internal-circuit reset signal generating unit delays the power-on adjustment voltage by a predetermined time, and then compares the voltage level of the internal reference voltage with the voltage level of the delayed power-on adjustment voltage to generate a reset signal for the internal circuit.

Accordingly, no matter how the level of the internal power supply voltage changes at the time of performing an adjustment test on the internal power supply voltage of an internal circuit, the reset signal for the internal circuit is not generated. Because the reset signal can be generated in accordance with the rising of the internal power supply voltage to be applied to the internal circuit, power-on resetting of the internal circuit can be carried out reliably.

Preferably, in the power supply voltage reset circuit, the internal-circuit reset signal generating unit includes a reset signal generating comparator that compares the voltage level of the internal reference voltage and the voltage level of the power-on adjustment voltage with each other to generate the reset signal.

In the power supply voltage reset circuit with the above-described structure, the internal-circuit reset signal generating unit generates a reset signal by comparing the voltage level of the internal reference voltage and the voltage level of the power-on adjustment voltage with each other by means of a reset signal generating comparator.

This makes it possible to easily generate the reset signal.

Preferably, in the power supply voltage reset circuit, the internal-circuit reset signal generating unit includes: a first step-down circuit unit that generates a power supply signal corresponding to the voltage level of the power-on adjustment voltage; and a reset signal generating comparator that generates the reset signal by comparing the voltage level of the internal reference voltage and the voltage level of the power supply signal with each other, the first step-down circuit unit has a first comparator and a first PMOS transistor, the power-on adjustment voltage is supplied to an inverting input terminal of the first comparator, an output of the first comparator is connected to a gate terminal of the first PMOS transistor, a drain of the first PMOS transistor is connected to a non-inverting input terminal of the first comparator, a source of the first PMOS transistor is connected to the power supply voltage of the apparatus, and the drain of the first PMOS transistor is an output terminal from which the power supply signal is output.

In the internal-circuit reset signal generating unit in the power supply voltage reset circuit with the above-described structure, a first step-down circuit unit including a first comparator and a first PMOS transistor generates a power supply signal corresponding to the voltage level of the power-on adjustment voltage from the power supply voltage, and generates a reset signal for the internal circuit by comparing the voltage level of the internal reference voltage with the voltage level of the power supply signal with each other.

Accordingly, the first step-down circuit unit including the first comparator and the first PMOS transistor can generate a power supply signal which is a power-on adjustment voltage signal delayed. At the time of generating the reset signal for the internal circuit, the reset signal can be generated in accordance with the rising of the internal power supply voltage to be applied to the internal circuit.

Preferably, in the power supply voltage reset circuit, the various-reference-voltages generating unit includes: a second step-down circuit unit that generates a voltage corresponding to the internal reference voltage and outputs the voltage thus generated from an output terminal; and a resistor divider that has a plurality of resistors connected in series between the output terminal of the second step-down circuit unit and a ground, the second step-down circuit unit has a second comparator, a second PMOS transistor, and a resistor, the internal reference voltage is supplied to an inverting input terminal of the second comparator, an output of the second comparator is connected to a gate terminal of the second PMOS transistor, a source of the second PMOS transistor is connected to the power supply voltage of the apparatus, a drain of the second PMOS transistor is connected to a non-inverting input terminal of the second comparator via the resistor, a node between the resistor and the non-inverting input terminal of the second comparator is the output terminal.

In the various-reference-voltages generating unit in the power supply voltage reset circuit with the above-described structure, a second step-down circuit unit including a second comparator, a second PMOS transistor, and a resistor generates a voltage corresponding to the internal reference voltage from the power supply voltage, and is connected with a resistor divider having a plurality of resistors connected in series to generate various reference voltages.

This makes it possible to easily to generate various stable reference voltages.

Preferably, in the power supply voltage reset circuit, the internal power supply voltage reference signal generating unit includes: a first selector that selects one of a plurality of voltage levels generated by the resistor divider; and a first amplifier that amplifies the voltage level selected by the first selector to generate the internal power supply voltage reference signal.

In the internal power supply voltage reference signal generating unit in the power supply voltage reset circuit with the above-described structure, a first selector selects one of a plurality of voltage levels generated by the resistor divider, and a first amplifier amplifies the selected voltage level to generate the internal power supply voltage reference signal.

Accordingly, it is possible to generate an internal power supply voltage reference signal of a desired voltage level and apply an internal power supply voltage of a voltage level corresponding to the internal power supply voltage reference signal to an internal circuit. This ensures easy execution of an adjustment test on the internal circuit and prevents generation of a reset signal for the internal circuit during the adjustment test.

Preferably, in the power supply voltage reset circuit, the power-on adjustment voltage generating unit includes: a second selector that selects one of a plurality of voltage levels generated by the resistor divider; and a second amplifier that amplifies the voltage level selected by the second selector to generate the power-on adjustment voltage.

In the power-on adjustment voltage generating unit in the power supply voltage reset circuit with the above-described structure, a second selector selects one of a plurality of voltage levels generated by the resistor divider, and a second amplifier amplifies the selected voltage level to generate the power-on adjustment voltage.

Accordingly, it is possible to generate a power-on adjustment voltage of a desired voltage level and generate a reset signal based on the power-on adjustment voltage and the internal reference voltage.

Preferably, in the power supply voltage reset circuit, the internal power supply voltage generating unit includes a third step-down circuit unit having a third comparator and a third PMOS transistor, the internal power supply voltage reference signal is supplied to an inverting input terminal of the third comparator, an output of the third comparator is connected to a gate terminal of the third PMOS transistor, a drain of the third PMOS transistor is connected to a non-inverting input terminal of the third comparator, a source of the third PMOS transistor is connected to the power supply voltage of the apparatus, a node between the third PMOS transistor and a non-inverting input terminal of the third comparator serves as an output terminal from which the internal power supply voltage corresponding to the internal power supply voltage reference signal is output to the internal circuit.

In the internal power supply voltage generating unit in the power supply voltage reset circuit with the above-described structure, a third step-down circuit unit including a third comparator and a third PMOS transistor generates an internal power supply voltage corresponding to the internal power supply voltage reference signal from the power supply voltage, and outputs the internal power supply voltage to an internal circuit.

Accordingly, it is possible to stably output the internal power supply voltage corresponding to the internal power supply voltage reference signal to an internal circuit.

Preferably, in the power supply voltage reset circuit, the apparatus is a semiconductor integrated device including a DRAM.

This makes it possible to suppress generation of a reset signal for an internal circuit at the time of performing an adjustment test on the internal circuit in a semiconductor integrated device, such as DRAM.

A reset signal generating method in accordance with the present invention is a method in a power supply voltage reset circuit, provided in an apparatus having an internal circuit capable of variably adjusting an internal power supply voltage, for resetting the internal circuit when a power supply voltage of the apparatus rises, and the method includes: generating an internal power supply voltage reference signal for adjusting the internal power supply voltage and changing a signal level of the internal power supply voltage reference signal to adjust the internal power supply voltage; generating an internal reference voltage to be a reference level in generating a reset signal for the internal circuit at a time of rising of the power supply voltage of the apparatus; generating a power-on adjustment voltage which rises later than the internal reference voltage at the time of rising of the power supply voltage of the apparatus and whose voltage level becomes greater than that of the internal reference voltage after a predetermined time passes; and generating the reset signal by comparing the voltage level of the internal reference voltage with the voltage level of the power-on adjustment voltage.

Through the foregoing steps, a power-on adjustment voltage for generating a reset signal upon power-on of an internal circuit is generated, independently of an internal power supply voltage reference signal for adjusting an internal power supply voltage of the internal circuit. A reset signal for the internal circuit is generated by comparing the voltage level of the power-on adjustment voltage with the voltage level of the internal reference voltage with each other.

Accordingly, no matter how the level of the internal power supply voltage changes at the time of performing an adjustment test on the internal power supply voltage of an internal circuit, the reset signal for the internal circuit is not generated.

Preferably, in the reset signal generating method, the reset signal is generated by delaying the power-on adjustment voltage by a predetermined time and comparing the voltage level of the internal reference voltage with the voltage level of the power-on adjustment voltage thus delayed.

Through the foregoing steps, a power-on adjustment voltage for generating a reset signal upon power-on of an internal circuit is generated, independently of an internal power supply voltage reference signal for adjusting an internal power supply voltage of the internal circuit. A reset signal for the internal circuit is generated by delaying the power-on adjustment voltage by a predetermined time and then comparing the voltage level of the internal reference voltage with the voltage level of the delayed power-on adjustment voltage.

Accordingly, no matter how the level of the internal power supply voltage changes at the time of performing an adjustment test on the internal power supply voltage of an internal circuit, the reset signal for the internal circuit is not generated. Because the reset signal can be generated in accordance with the rising of the internal power supply voltage to be applied to the internal circuit, power-on resetting of the internal circuit can be carried out reliably.

As described above, in the power supply voltage reset circuit of the present invention, a power-on adjustment voltage for generating a reset signal upon power-on of an internal circuit is generated, independently of a signal for adjusting an internal power supply voltage of the internal circuit. This makes it possible to suppress generation of a reset signal for an internal circuit, depending on the level of an internal power supply voltage under adjustment at the time of performing an adjustment test on the internal power supply voltage of the internal circuit, thus ensuring smooth execution of the adjustment test.

DETAILED DESCRIPTION OF THE INVENTION

Embodiments of the present invention will now be described with reference to the accompanying drawings.

First Embodiment

Figure 1:
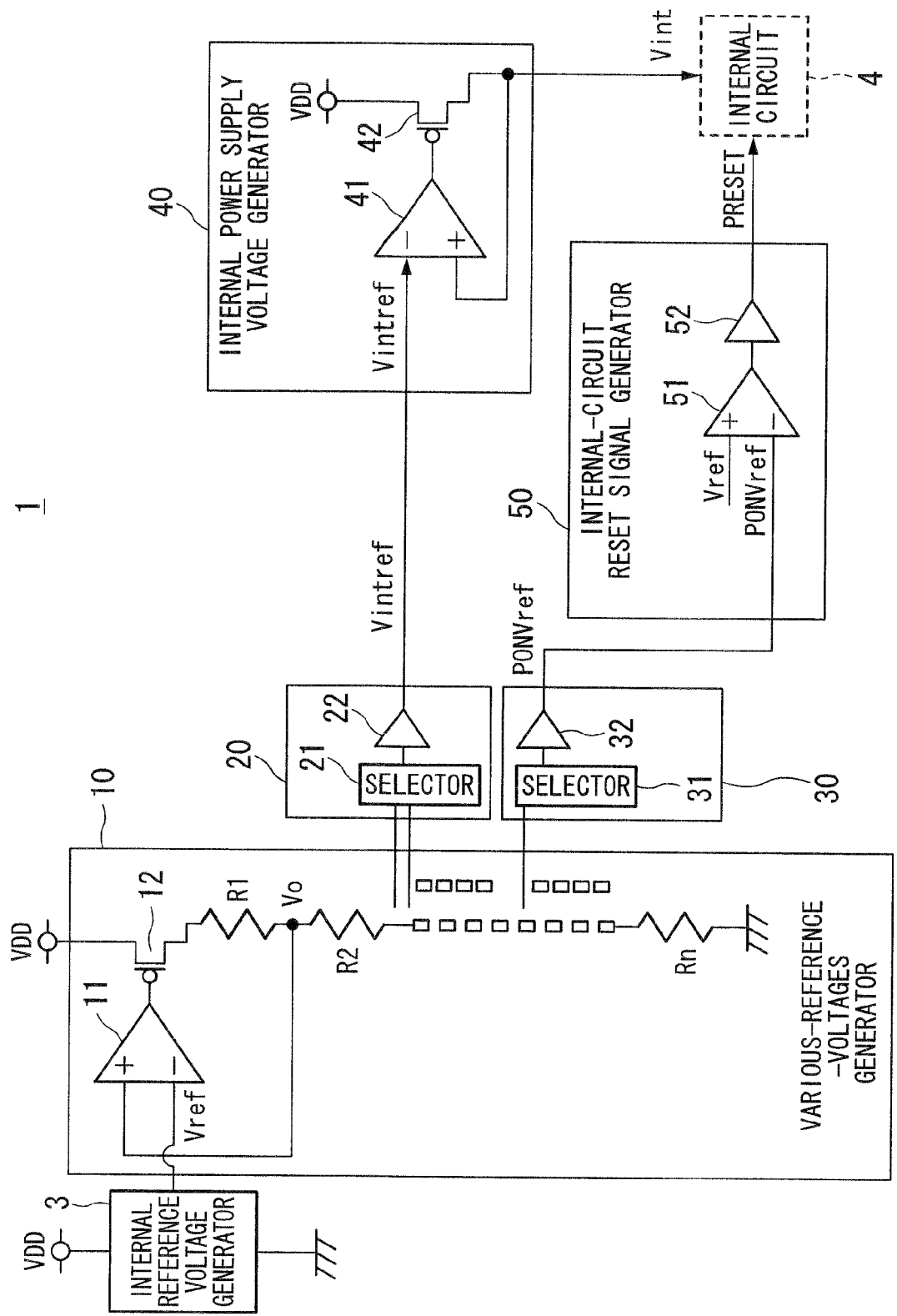
FIG. 1 is a block diagram showing the structure of a power supply voltage reset circuit in accordance with a first embodiment of the present invention.

FIG. 1 is a block diagram showing the structure of a power supply voltage reset circuit 1 in accordance with a first embodiment of the present invention.

The power supply voltage reset circuit 1 shown in FIG. 1 includes an internal reference voltage generator 3 which generates an internal reference voltage Vref, a various-reference-voltages generator 10 which generates various reference voltage levels, an internal power supply voltage reference signal generator 20 which generates an internal power supply voltage reference signal Vintref to be a reference signal for an internal power supply voltage (working voltage) of an internal circuit, a PON (Power ON) adjustment voltage generator 30 which generates a power-on (PON) adjustment voltage PONVref to be used in generating a reset signal upon power-on of the internal circuit, an internal power supply voltage generator 40 which generates the internal power supply voltage (working voltage) of the internal circuit, and an internal-circuit reset signal generator 50 which generates a reset signal PRESET.

The internal reference voltage generator 3 generates the internal reference voltage Vref, which is used in generating the reset signal PRESET, from a power supply voltage VDD, and outputs the internal reference voltage Vref.

The various-reference-voltages generator 10 has a step-down circuit section which includes a comparator 11, a PMOS (P-channel Metal Oxide Semiconductor) transistor (P channel MOSFET (MOS Field Effect Transistor) or the like) 12, and a resistor R1. The step-down circuit section reduces the power supply voltage VDD. In the step-down circuit section, the internal reference voltage Vref is supplied to the inverting input terminal of the comparator 11 whose output is connected to the gate terminal of the PMOS transistor 12 which has a source connected to the power supply voltage VDD and a drain connected to the non-inverting input terminal of the comparator 11 via the resistor R1. With this structure, the comparator 11 compares the voltage level of the internal reference voltage Vref with the voltage level of an output voltage Vo and controls the output voltage Vo to match with the internal reference voltage Vref.

A resistor divider having a plurality of resistors R2 to Rn (n being an integer equal to or greater than 2) connected in series is provided between a node of the output voltage Vo in the step-down circuit section and ground. Signals of resistor-divided voltage levels (signals to be various reference voltages) are generated at nodes between adjacent resistors in the resistors R2 to Rn constituting the resistor divider. Two of those resistor nodes are respectively connected to a selector 21 in the internal power supply voltage reference signal generator 20 and a selector 31 in the PON adjustment voltage generator 30, so that the selector 21 and the selector 31 can select voltage levels divided by the resistor divider. The selector 21 and the selector 31 can be controlled independently.

The voltage level selected by the selector 21 in the internal power supply voltage reference signal generator 20 (voltage level selected from the resistor-divided voltage levels) is amplified by an amplifier 22 to generate the internal power supply voltage reference signal Vintref. Likewise, the voltage level selected by the selector 31 in the PON adjustment voltage generator 30 (voltage level selected from the resistor-divided voltage levels) is amplified by an amplifier 32 to generate the PON adjustment voltage PONVref.

The internal power supply voltage reference signal Vintref output from the amplifier 22 is input to the internal power supply voltage generator 40. In the internal power supply voltage generator 40, the internal power supply voltage reference signal Vintref is supplied to the inverting input terminal of a comparator 41 whose output is connected to the gate terminal of a PMOS transistor 42 which has a drain connected to the non-inverting input terminal of the comparator 41 and a source connected to the power supply voltage VDD. With this structure, the internal power supply voltage Vint (=Vintref) is generated from the power supply voltage VDD and is supplied to an internal circuit 4.

The PON adjustment voltage PONVref output from the amplifier 32 is input to the internal-circuit reset signal generator 50 including a comparator 51 and a buffer gate 52. In the internal-circuit reset signal generator 50, the comparator 51 compares the voltage level of the internal reference voltage Vref with the voltage level of the PON adjustment voltage PONVref with each other to generate the reset signal PRESET for the internal circuit 4. The power-on resetting of the internal circuit 4 is executed in response to the reset signal PRESET.

Figure 2A:
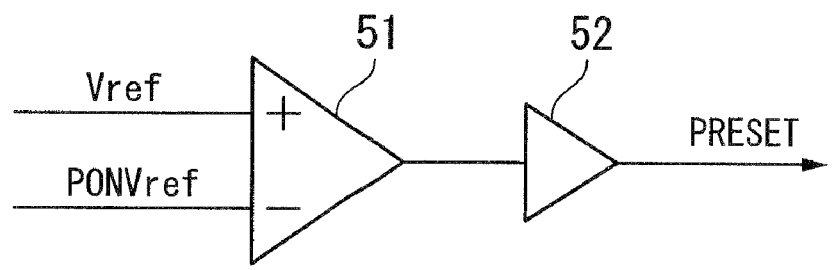
FIG. 2A is a block diagram of only an internal-circuit reset signal generator 50 extracted from FIG. 1.
Figure 2B:
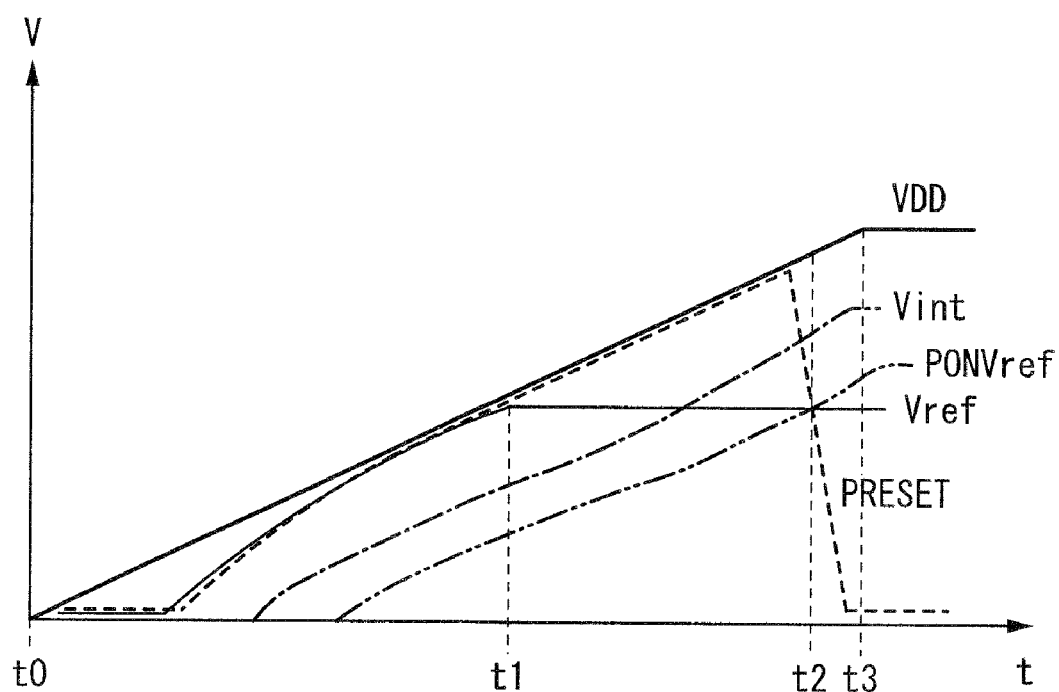
FIG. 2B is a diagram showing waveforms at individual sections shown in FIG. 1 at the rising of the power supply voltage.

FIGS. 2A and 2B are diagrams for explaining the operation of the internal-circuit reset signal generator 50, and FIG. 2B shows waveforms at individual sections at the rising of the power supply voltage. In FIG. 2B, when the power supply voltage VDD starts rising at time t0, the voltages at the individual sections start increasing and the level of the internal reference voltage Vref is settled at time t1 first.

The PON adjustment voltage PONVref output from the amplifier 32 in the PON adjustment voltage generator 30 rises independent of the internal power supply voltage Vint, and changes in a state of Vref>PONVref before time t2.

As Vref>PONVref before time t2, the reset signal PRESET becomes a high level. The high level of the reset signal PRESET causes power-on resetting of the internal circuit 4.

As Vref<PONVref after time t2, the reset signal PRESET becomes a low level, canceling the reset state of the internal circuit 4. After time t3, the voltages at the individual sections are settled, and the internal circuit 4 completes the power-on resetting to be in an operational state.

As described above, the power supply voltage reset circuit 1 shown in FIG. 1 generates the PON adjustment voltage PONVref different from the internal power supply voltage Vint of the internal circuit 4 (or the internal power supply voltage reference signal Vintref for generating the internal power supply voltage Vint), and compares the internal reference voltage Vref with the PON adjustment voltage PONVref to generate the reset signal PRESET for the internal circuit 4.

When the PON adjustment voltage PONVref is lower than the internal reference voltage Vref, the high-level reset signal PRESET is generated to reset the internal circuit (peripheral circuit) 4. When the PON adjustment voltage PONVref becomes higher than the internal reference voltage Vref, the low-level reset signal PRESET is generated to stop the resetting of the internal circuit 4.

Accordingly, once the power supply voltage VDD and the internal power supply voltage Vint rise, generation of the reset signal for the internal circuit 4 depending on the voltage level of the internal power supply voltage Vint is avoided at the time of performing a test for adjusting the internal power supply voltage Vint by changing the internal power supply voltage reference signal Vintref.

The comparator 11 serves as the second comparator, the PMOS transistor 12 serves as the second PMOS transistor, and the comparator 11 and the PMOS transistor 12 serve as the second step-down circuit unit. The comparator 41 serves as the third comparator, the PMOS transistor 42 serves as the third PMOS transistor, and the comparator 41 and the PMOS transistor 42 serve as the third step-down circuit unit. The comparator 51 serves as the reset signal generating comparator. The selector 21 serves as the first selector, the amplifier 22 serves as the first amplifier, the selector 31 serves as the second selector, and the amplifier 32 serves as the second amplifier.

Second Embodiment

Figure 3:
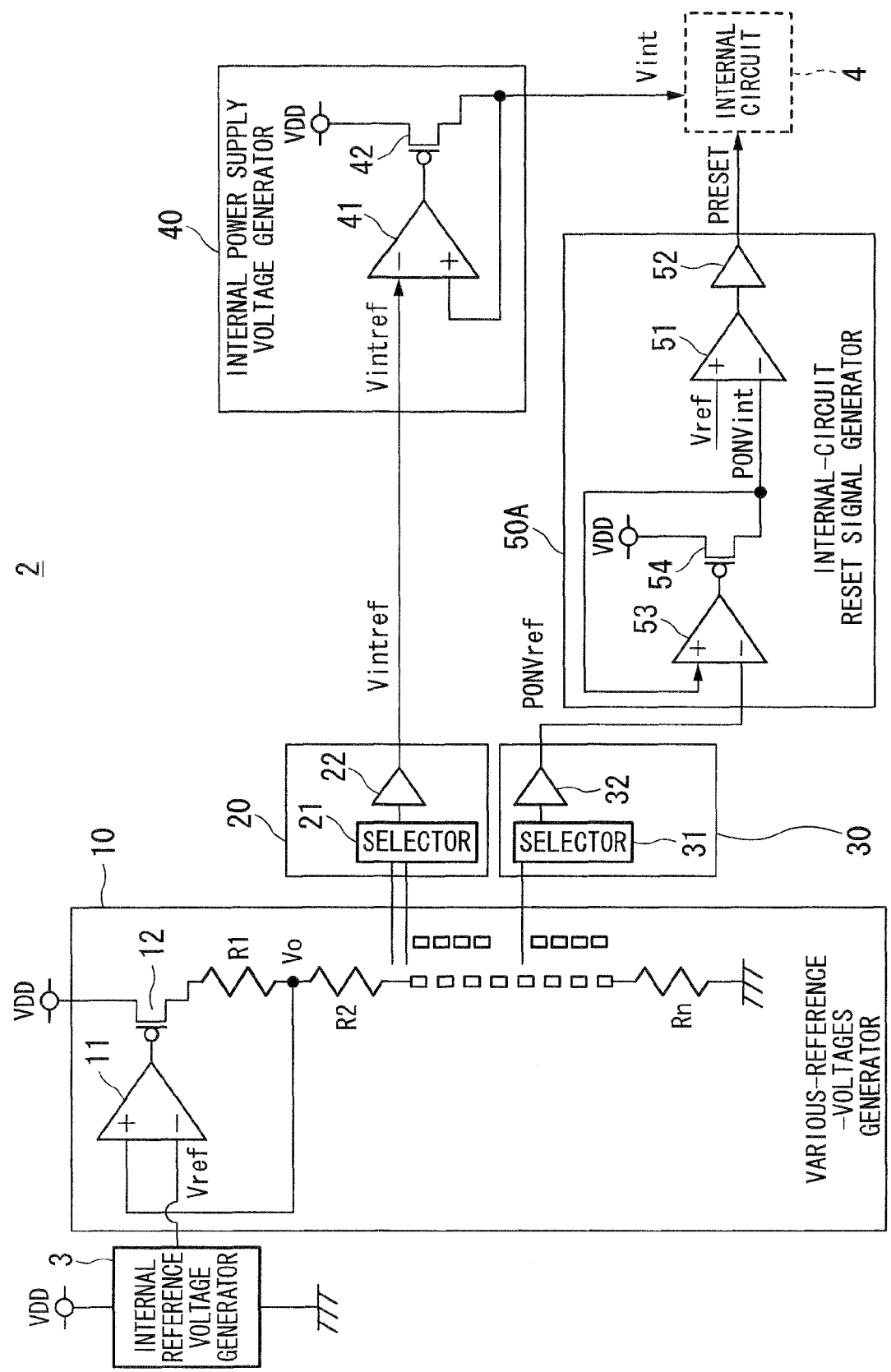
FIG. 3 is a block diagram showing the structure of a power supply voltage reset circuit in accordance with a second embodiment of the present invention.
Figure 4A:
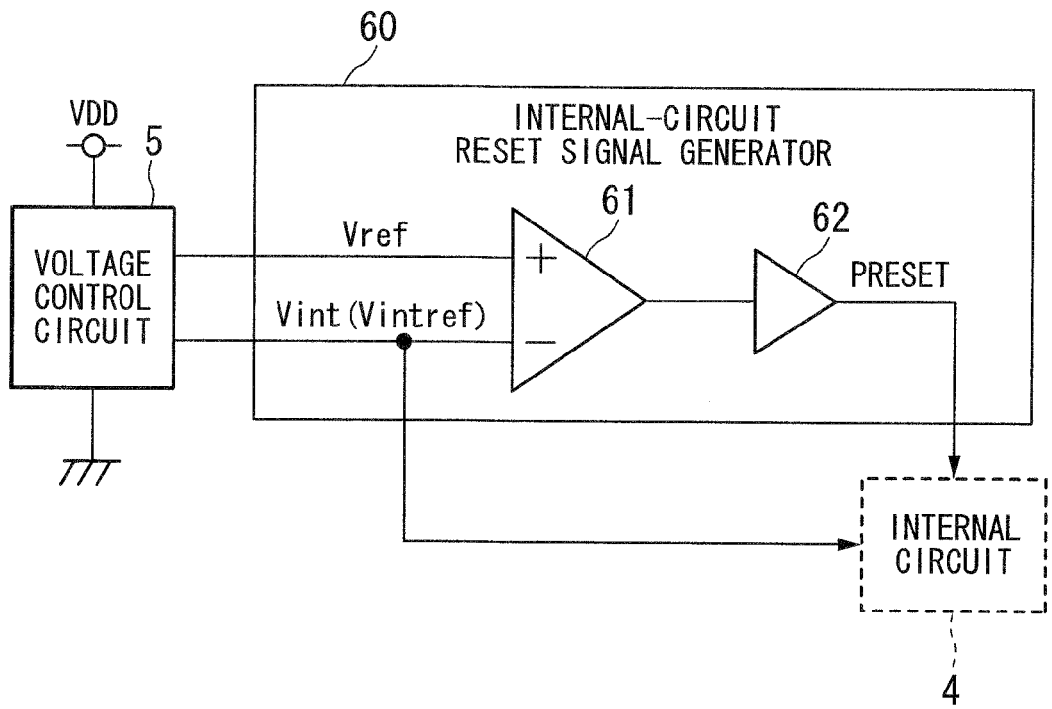
FIG. 4A is a block diagram showing the structure of a conventional reset circuit.
Figure 4B:
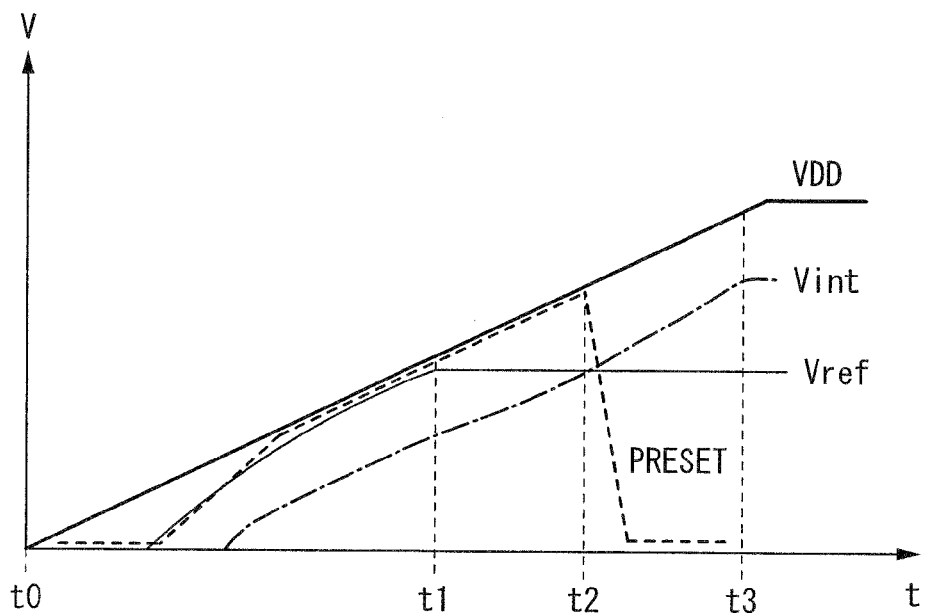
FIG. 4B is a diagram showing waveforms at individual sections shown in FIG. 4A at the rising of the power supply voltage.
Figure 5:
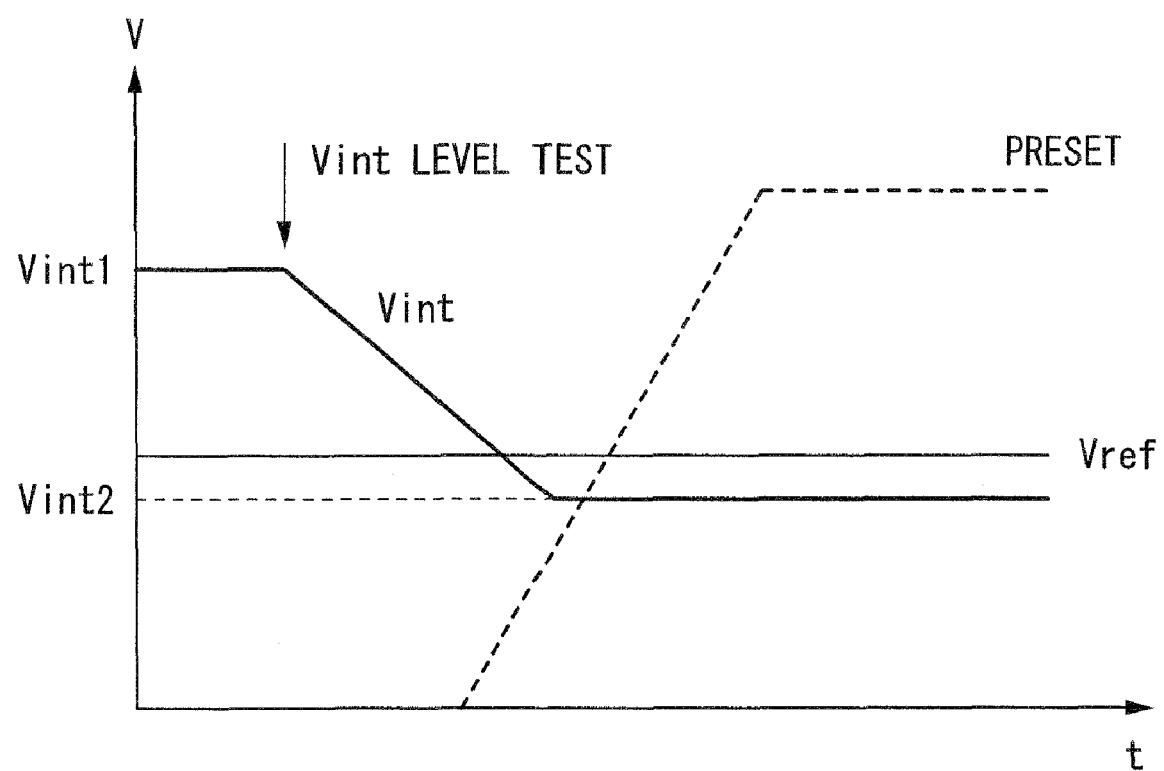
FIG. 5 is a diagram for explaining a problem such that a reset signal is generated at the time of performing a test for adjusting the power supply voltage of an internal circuit.

FIG. 3 is a block diagram showing the structure of a power supply voltage reset circuit 2 in accordance with a second embodiment of the present invention. The power supply voltage reset circuit 2 shown in FIG. 3 differs from the power supply voltage reset circuit 1 shown in FIG. 1 in that the internal-circuit reset signal generator 50 shown in FIG. 1 is replaced with an internal-circuit reset signal generator 50A shown in FIG. 3, and is identical to the power supply voltage reset circuit 1 in the structure of the other sections and the operation.

The internal-circuit reset signal generator 50A shown in FIG. 3 has a step-down circuit section including a comparator 53 and a PMOS transistor 54. In the step-down circuit section, the PON adjustment voltage PONVref is supplied to the inverting input terminal of the comparator 53 whose output is connected to the gate terminal of the PMOS transistor 54 which has a drain connected to the non-inverting input terminal of the comparator 53 and a source connected to the power supply voltage VDD. With this structure, a power supply voltage PONVint whose voltage level corresponds to the voltage level of the PON adjustment voltage PONVref is generated from the power supply voltage VDD. The comparator 51 compares the voltage level of the power supply voltage PONVint with the voltage level of the internal reference voltage Vref with each other to generate a reset signal PRESET for the internal circuit 4.

This structure can permit the reset signal PRESET to be generated with a delay corresponding to the delay of the rising of the internal power supply voltage Vint with respect to the internal power supply voltage reference signal Vintref. Accordingly, the power-on resetting of the internal circuit 4 can be carried out reliably.

The comparator 53 serves as the first comparator, the PMOS transistor 54 serves as the first PMOS transistor, and the comparator 53 and the PMOS transistor 54 serve as the first step-down circuit unit.

The individual embodiments of the present invention can avoid generation of a reset signal during adjustment of the voltage level of the internal power supply voltage of an internal circuit in a semiconductor integrated device, and are thus effective as a power supply voltage reset circuit for a semiconductor integrated device such as DRAM.

While preferred embodiments of the present invention have been described and illustrated above, it should be understood that these are exemplary of the present invention and are not to be considered as limiting. Additions, omissions, substitutions, and other modifications can be made without departing from the gist or scope of the present invention. Accordingly, the present invention is not to be considered as being limited by the foregoing description, and is only limited by the scope of the appended claims.

What is claimed is:

1. A device, comprising:
   a first voltage generating circuit generating an internal voltage;
   an internal circuit brought into a reset state in response to a reset signal and released from the reset state to operate on the internal voltage;
   a reset signal generating circuit generating the reset signal in response to a first reference voltage that is produced independently of the internal voltage, the reset signal generating circuit supplying the reset signal to the internal circuit; and
   a second voltage generating circuit generating a first voltage and the first reference voltage in response to a power supply voltage, the second voltage generating circuit supplying the first voltage to the first voltage generating circuit so that the first voltage generating circuit generating the internal voltage in response to the first voltage and supplying the first reference voltage to the reset signal generating circuit.

2. The device as claimed in claim 1, wherein the second voltage generating circuit is configured to control the first voltage so that the first voltage varies independently of the first reference voltage.

3. The device as claimed in claim 1, wherein the first voltage and the first reference voltage are dependent on a variation of the power supply voltage.

4. The device as claimed in claim 1, further comprising a reference voltage generating circuit generating a second reference voltage in response to the power supply voltage, and wherein the reset signal generating circuit receives the second reference voltage, activates, when the first reference voltage is lower in level than the second reference voltage, the reset signal so that the internal circuit is brought into the reset state, and deactivates, when the first reference voltage is higher in level than the second reference voltage, the reset signal so that the internal circuit is released from the reset state.

5. The device as claimed in claim 1, wherein the second voltage generating circuit includes a voltage dividing circuit and first and second selectors, the voltage dividing circuit generates a plurality of divided voltages different in level from each other in response to the power supply voltage, the first selector selectively supplies one of the divided voltages to the first voltage generating circuit as the first voltage, the second selector selectively supplies one of the divided voltages to the reset signal generating circuit as the first reference voltage.

6. The device as claimed in claim 5, wherein the first and second selectors are controlled independently of each other.

7. The device as claimed in claim 1, wherein the reset signal generating circuit includes a first comparator circuit and a first transistor, the first comparator comprises a first input node supplied with the first reference voltage, a second input node and a first output node, the first transistor comprises a first electrode supplied with the power supply voltage, a second electrode coupled to the second input node of the first comparator and a control electrode coupled to the first output node of the first comparator.

8. The device as claimed in claim 7, further comprising a reference voltage generating circuit generating a second reference voltage in response to the power supply voltage, and wherein the reset signal generating circuit includes a second comparator circuit comprising a third input node coupled to the second electrode of the first transistor, a fourth input node supplied with the second reference voltage and a second output node coupled to the internal circuit so as to supply the reset signal to the internal circuit.

9. A method, comprising:
   generating an internal voltage;
   bringing an internal circuit into a reset state in response to a reset signal;
   releasing the internal circuit from the reset state to allow the internal circuit to operate on the internal voltage;
   generating a reference voltage independently of the internal voltage;
   generating the reset signal in response to the reference voltage;
   generating a plurality of first voltages in response to a power supply voltage;
   selecting one of the first voltages as a second voltage so that the internal voltage is generated in response to the second voltage;
   selecting one of the first voltages as the reference voltage; and
   changing the second voltage from the one of the first voltages to another of the first voltages so that the second voltage varies independently of the reference voltage.

10. A device, comprising:
    a first voltage generating circuit generating a plurality of voltages that are different from each other;
    a first reference signal circuit receiving the plurality of voltages and selecting one of the plurality of voltages to output as a first selected voltage;
    a second voltage generating circuit receiving the first selected voltage and generating an internal voltage in response to the first selected voltage;
    a second reference signal circuit receiving the plurality of voltages and selecting one of the plurality of voltages to output as a second selected voltage, the second reference signal circuit being independent of the first reference signal circuit;

a reset signal generating circuit receiving the second selected voltage and generating a reset signal in response to a second selected voltage, the reset signal having active and inactive levels; and an internal circuit holding a reset state when the reset signal has the active level and releasing from the reset state when the reset signal changes from the active level to the inactive level.

11. The device of claim 10, wherein the reset signal generating circuit is coupled to the internal circuit and supplies the reset signal to the internal circuit.

12. The device of claim 10, wherein a voltage level of the internal voltage is independent of a voltage of the reset signal.

13. The device of claim 10, wherein the first voltage generating circuit generates the plurality of voltages substantially simultaneously.

14. The device of claim 10, further comprising a third voltage generating circuit supplying a reference voltage to the first voltage generating circuit, and wherein the first voltage generating circuit generates the plurality of voltages in response to the reference voltage.

* * * * *